US008618841B1

(12) United States Patent
Cloutier

(10) Patent No.: US 8,618,841 B1
(45) Date of Patent: Dec. 31, 2013

(54) METHOD FOR REDUCING SPURIOUS FOR A CLOCK DISTRIBUTION SYSTEM

(71) Applicant: Mark Cloutier, Gatineau (CA)

(72) Inventor: Mark Cloutier, Gatineau (CA)

(73) Assignee: Hittite Microwave Corporation, Chelmsford, MA (US)

( * ) Notice: Subject to any disclaimer, the term of this patent is extended or adjusted under 35 U.S.C. 154(b) by 0 days.

(21) Appl. No.: 13/663,926

(22) Filed: Oct. 30, 2012

(51) Int. Cl.
*H03B 21/00* (2006.01)

(52) U.S. Cl.
USPC ............ 327/107; 327/34; 327/156; 327/291; 327/379; 327/551

(58) Field of Classification Search
USPC ......... 327/105–107, 156, 291–305, 378–391, 327/530–559, 34, 309–330; 700/400–401, 700/500–503
See application file for complete search history.

(56) References Cited

U.S. PATENT DOCUMENTS

| 5,028,887 | A | * | 7/1991 | Gilmore | 331/18 |
| 5,144,254 | A | * | 9/1992 | Wilke | 327/107 |
| 5,521,533 | A | | 5/1996 | Swanke | |
| 5,847,611 | A | | 12/1998 | Hirata | |
| 6,081,022 | A | | 6/2000 | Mitra et al. | |
| 7,848,266 | B2 | * | 12/2010 | Man et al. | 370/277 |
| 8,122,277 | B1 | | 2/2012 | Chandra et al. | |
| 8,125,277 | B1 | * | 2/2012 | Opsahl | 331/1 A |
| 8,477,444 | B1 | * | 7/2013 | Zou et al. | 360/51 |
| 8,531,217 | B2 | * | 9/2013 | Cloutier et al. | 327/156 |
| 2011/0200076 | A1 | | 8/2011 | Mu et al. | |

* cited by examiner

*Primary Examiner* — Lincoln Donovan
*Assistant Examiner* — Thomas Skibinski
(74) *Attorney, Agent, or Firm* — Iandiorio Teska & Coleman, LLP

(57) ABSTRACT

A method for reducing spurious for a clock distribution system, the method including a) providing a system controller, b) providing clock distribution system, c) inputting characteristics of the clock distribution system in advance of operation thereof, d) calculating an expected level of the integer boundary spurious as a function of a fractional offset value, e) selecting an integer boundary solution based on the fractional offset value being within a preferred predetermined region, and f) programming the master clock subsystem and the one or more fractional synthesizers with the integer boundary solution, and g) repeating steps d) through f) as needed.

20 Claims, 5 Drawing Sheets

METHOD FOR REDUCING SPURIOUS FOR A CLOCK DISTRIBUTION SYSTEM

FIELD OF THE INVENTION

The invention is relates to a method for reducing spurious for a clock distribution system.

BACKGROUND OF THE INVENTION

Many attempts have been made to reduce spurious emissions in synthesizers of a clock distribution system. The problem is especially difficult in wideband synthesizers of a clock distribution system that operate over multiple octaves. Reducing spurious is also more difficult when using a clock distribution system with synthesizers based upon integrated circuits because shielding of different components in the synthesizer may be difficult or simply not possible.

U.S. Pat. No. 5,847,611 attempts to reduce spurious by modifying the fractional synthesizer itself. U.S. Pat. No. 6,081,022 attempts to reduce spurious by improving the clock distribution by improving shielding. Such a design may offer small improvements. U.S. Pub. No. US2011/0200076 attempts to reduce spurious with a spurious tone cancellation approach. Such a method is complex and removes the spurious after it is created. U.S. Pat. No. 5,521,533 relies on a complex approach to reduce spurious with two direct digital synthesizers (DDS). U.S. Pat. No. 8,122,277 attempts to reduce spurious with a clock distribution chip that is similar to many commercially available clock distribution chips. However, such commercially available clock distribution chips fail to provide any guidance on how to configure the chip or how to predict the location of the fractional spurious outputs. Moreover, the output fractional synthesizer is not part of the solution.

SUMMARY OF THE INVENTION

In one aspect, a method for reducing spurious for a clock distribution system is featured. The method includes a) providing a system controller, b) providing clock distribution system, including: a master clock subsystem responsive to an external reference signal configured to generate a master clock signal and one or more intermediate clock signals each at a sub-multiple of the master clock signal, and one or more fractional synthesizers each responsive to one of the one or more intermediate clock signals and each configured to generate an output signal at a desired frequency from a wide range of possible output frequencies based on a command from the system controller, c) inputting characteristics of the clock distribution system in advance of operation thereof, d) calculating an expected level of the integer boundary spurious as a function of fractional offset value to select a preferred region of operation, e) providing a desired operating frequency of the output signal, f) selecting an integer boundary solution based on the fractional offset value being within a preferred predetermined region, and g) programming the master clock subsystem and the one or more fractional synthesizers with the integer boundary solution, and h) repeating steps e) through g) as needed.

In one embodiment, the external reference signal may have a fixed frequency. The characteristics of the clock distribution subsystem may include integer boundary (IB) spurious levels and higher order IB Spurious levels over the operating range of the one or more fractional synthesizers at the typical spurious levels. The characteristics of clock distribution subsystem may include typical spurious rolloff rates of IB spurs or higher order IB spurs as the one or more fractional synthesizers is tuned away from an IB or a higher order IB. The input characteristics of the clock distribution subsystem may include a typical loop bandwidth of the one or more fractional synthesizers. The input characteristics of the clock distribution subsystem may include a reference clock signal synthesized by the master clock subsystem. The reference clock signal may have a fixed frequency. The input characteristics of the clock distribution subsystem may include a realizable range of M-divider settings of the master clock subsystem. The characteristics of the clock distribution subsystem may include a realizable range of R-divider settings of the master clock subsystem and the one or more frequency synthesizers. The input characteristics of the clock distribution subsystem may include a minimum limit or a maximum limit of a fractional divider of each of the one or more fractional synthesizers. The input characteristics of the clock distribution system may include a minimum limit or a maximum limit of the values of the greatest common divisor of a frequency of the output signal and the phase detector frequency. The input characteristics of the clock distribution system may include specific integer parts of the values of the fractional divider to be excluded. The input characteristics of the clock distribution system may include a minimum limit or maximum limit of the intermediate clock frequency at the input to the one or more fractional synthesizers. The input characteristics of the clock distribution system may include a minimum limit or a maximum limit of a phase detector clock frequency at the input to the one or more fractional synthesizers. The input characteristics of the clock distribution system may include the one or more fractional synthesizers having a fixed modulus. The input characteristics of the clock distribution system may include minimum spurious levels of IB spurs or higher order IB spurs for each of the one or more fractional synthesizers as it is tuned away from an IB or a higher order IB. The input characteristics of the clock distribution system may include allowable values of a fractional divider of the one or more fractional synthesizers. The input characteristics of the clock distribution system may include a minimum limit or a maximum limit of the frequency of a voltage controlled oscillator for the one or more fractional synthesizers. The input characteristics of the clock distribution system may include available values of division for a divider at the output to the one or more phase synthesizers.

In another aspect, a method for reducing spurious for a clock distribution system is featured. The method includes a) providing a system controller, b) providing clock distribution system including: a master clock subsystem responsive to an external reference signal configured to generate a master clock signal and one or more intermediate clock signals each at a sub-multiple of the master clock signal, and one or more fractional synthesizers each responsive to one of the one or more intermediate clock signals and each configured to generate an output signal at a desired frequency from a wide range of possible output frequencies based on a command from the system controller, c) inputting characteristics of the clock distribution system in advance of operation thereof, d) providing a desired operating frequency of the output signal, e) calculating possible candidate frequencies of the one or more intermediate clock signals, f) calculating possible candidate frequencies of a phase detector of each of said one or more fractional synthesizers, g) calculating the frequency offset from the nearest integer boundary (IB) of each of said candidate frequencies, h) calculating integer and fractional parts of the output signal for each of the candidate frequencies, i) rejecting any candidate frequencies outside of an acceptable range of said characteristics of the clock distribution system, j) calculating an expected level of the integer boundary spurious for each remaining candidate frequency, k) if any of said candidate frequencies are an integer boundary solution, select that candidate frequency solution, otherwise, select a candidate frequency solution that generates the lowest expected level of the integer boundary spurious, l) programming the master clock subsystem and the one or more fractional synthesizers with the candidate frequency solution, and m) repeating steps d) through l) as needed.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Figure 1:
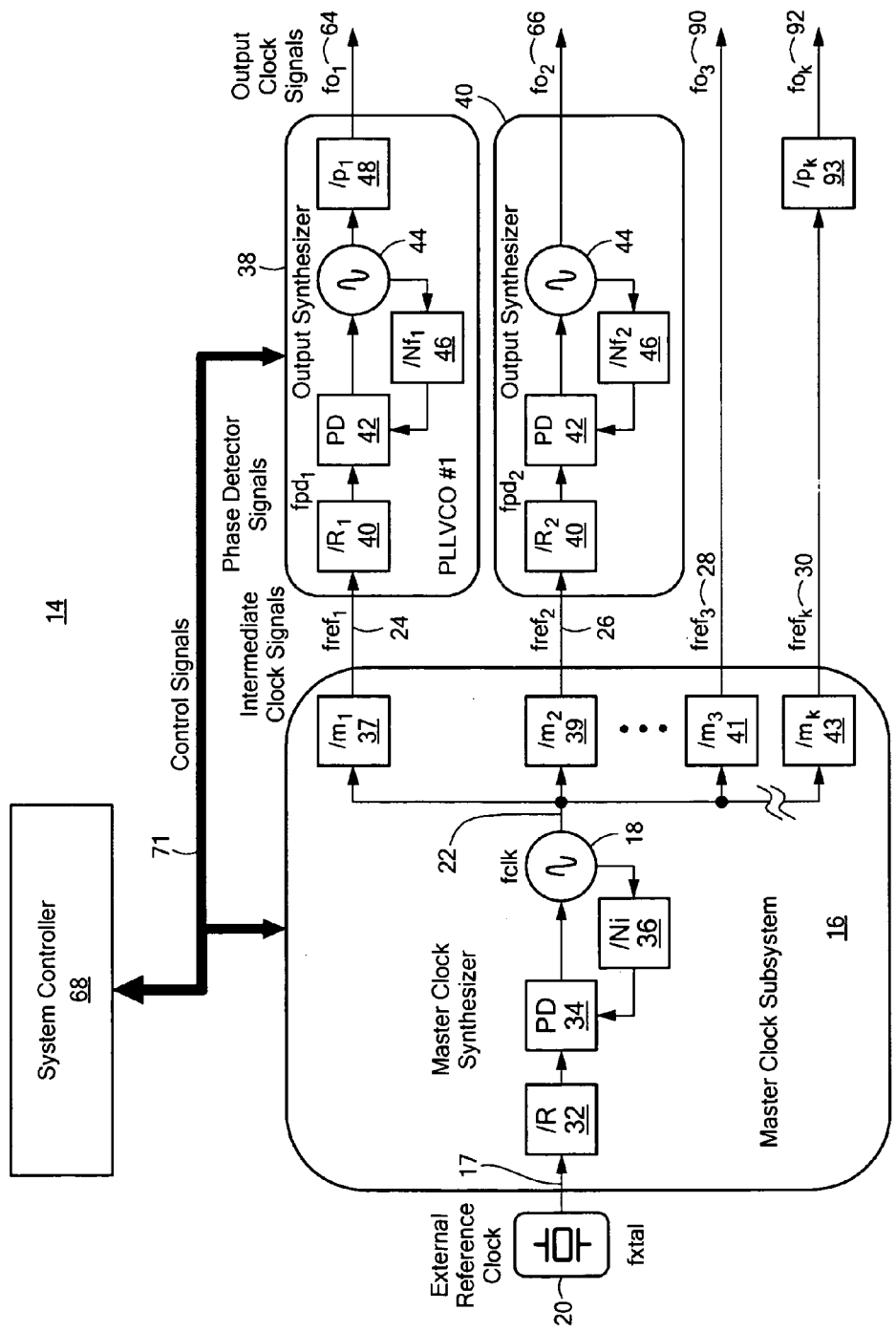
FIG. 1 is a schematic block diagram showing the primary components of a typical clock distribution system.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer. It is common in clock distribution systems for cellular base stations to have a single fixed reference clock signal, $f_{clk}$, used to clock multiple circuits of different types. FIG. 1 shows a typical exemplary clock distribution system 14 which includes master clock subsystem 16 responsive to an external reference signal by line 17, e.g., from an external reference clock 20 or similar type device. Master clock subsystem 16 generates master clock signal $f_{clk}$-22 and one or more intermediate clock signals each at a sub-multiple of master clock signal, $f_{clk}$-22, e.g., $fref_1$-24, $fref_2$-26, $fref_3$-28 . . . $fref_k$-30. Master clock subsystem 16 typically includes VCO or clock signal generator 18, R-divider 32, phase detector 34, integer divider 36 and a plurality of M-dividers, e.g., M-dividers $m_1$-37, $m_2$-39, m3-41 . . . $m_k$-43 to generate master clock signal $f_{clk}$-22 typically at a fixed frequency and intermediate clock signals $fref_1$-24, $fref_2$-26, $fref_3$-28 . . . $fref_k$-30 at various desired frequencies. In some designs, a fractional divider may be used instead of integer divider –36 in master clock subsystem 16 to generate the output signal $f_{clk}$-22. In this particular example, clock distribution system 14 includes two fractional synthesizers 38 and 40, as shown. Fractional synthesizer 38 includes R-divider 40, phase detector 42, VCO or clock signal generator 44, fractional divider 46, and integer divider 48. In this example, fractional synthesizer 40 includes all the same elements as fractional synthesizer 38, except that it does not include integer divider 48. Fractional synthesizers 38, 40 generate output signals $fo_1$-64 and $fo_2$-66, respectively.

System controller 68 is designed to send and receive control signals by bus lines 71 to master clock subsystem 16 and fractional synthesizers 38, 40. Fractional synthesizers 38, 40 generate output signals $fo_1$-64, $fo_2$-66, respectively, at a desired frequency from a wide range of possible frequencies based on a command from a system controller 68 by bus lines 71, discussed in further detail below.

Some of the output signals of the master clock subsystem, e.g., $fo_3$-90 and $fo_k$-92, may used to clock digital systems, data converters, and the like, at fixed clock rates. Typically, output signals $fo_3$-90, $fo_k$-92 are derived by dividing $f_{clk}$-22, by an integer with M-divider 41, 43, respectively. In this example $fo_k$-92 may be further divided by external divider $p_k$-93.

Other output signals from clock distribution system 14, in this example, $fo_1$-64 and $fo_2$-66, may be used to provide local oscillators for radio receivers and transmitters. The outputs of synthesizers 38, 40, often referred to as radio circuits, typically need to operate over a wide range of frequencies at precise channels and need to provide low phase noise and low spurious content. Typically, fractional synthesizers 38, 40 are used to generate the wideband output signals $fo_1$-64, $fo_2$-66 from different intermediate or reference clock signals, in this example, $fref_1$-24, $fref_2$-26, respectively, created by M-dividers 37, 39, respectively, where $m_1$ and $m_2$ as shown are integers. In some designs, an integer synthesizer may be used instead of fractional synthesizers 38, 40 to generate the wideband s output signals $fo_1$-64, $fo_2$-66.

Using single master clock reference signal $f_{clk}$-22 to derive intermediate clock signals $fref_1$-24, $fref_2$-26, $fref_3$-28 . . . $fref_k$-30 and output signals $fo_3$-90, $fo_k$-92 may create a restriction on $f_{clk}$-22 that it is typically at a fixed frequency.

Figure 4:
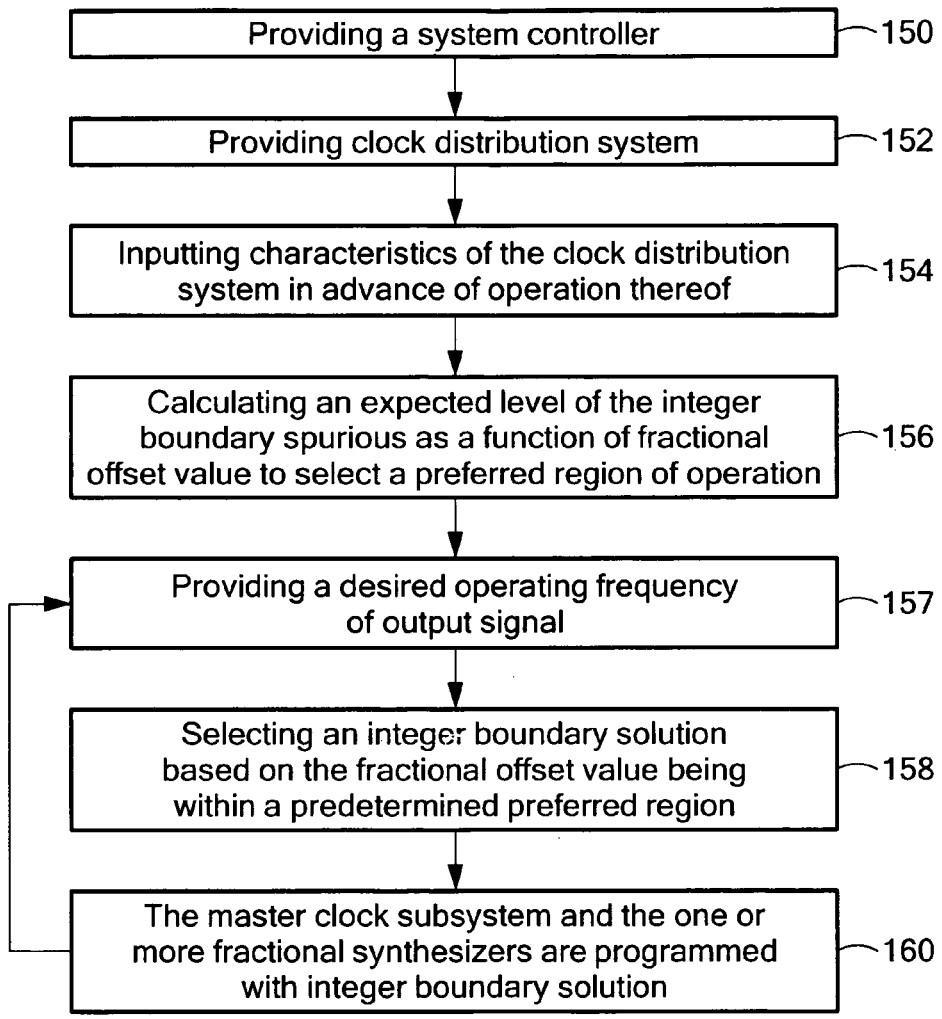
FIG. 4 is a flowchart showing the primary steps of another embodiment of the method for reducing spurious of a clock distribution system of this invention.

A common problem arises related to the frequency planning of clock distribution system 14. If the required output frequency, in this example, the frequency of output signals $fo_1$-64, $fo_2$-66, is not an integer multiple of its local reference signal, e.g., intermediate clock signals $fref_1$-24, $fref_2$-26, but is such that it must operate near a harmonic of the local reference signal or in some cases, near certain higher order sub-harmonics of the local reference signal, synthesizer 38 and/or synthesizer 40 is often referred to a operating near an integer boundary (IB) of the local reference signal or near an integer boundary of a sub-harmonic of the local reference signal, often referred to as a higher order boundary. The first order IB case may be the worst case while higher order boundaries are usually less severe. Typical spurious levels versus output frequency normalized to the first order integer boundary frequency interval are shown in FIG. 4. As disclosed herein, first order integer boundaries, or spurs, are in general referring to all orders of integer boundaries and spurs of interest.

Figure 5:
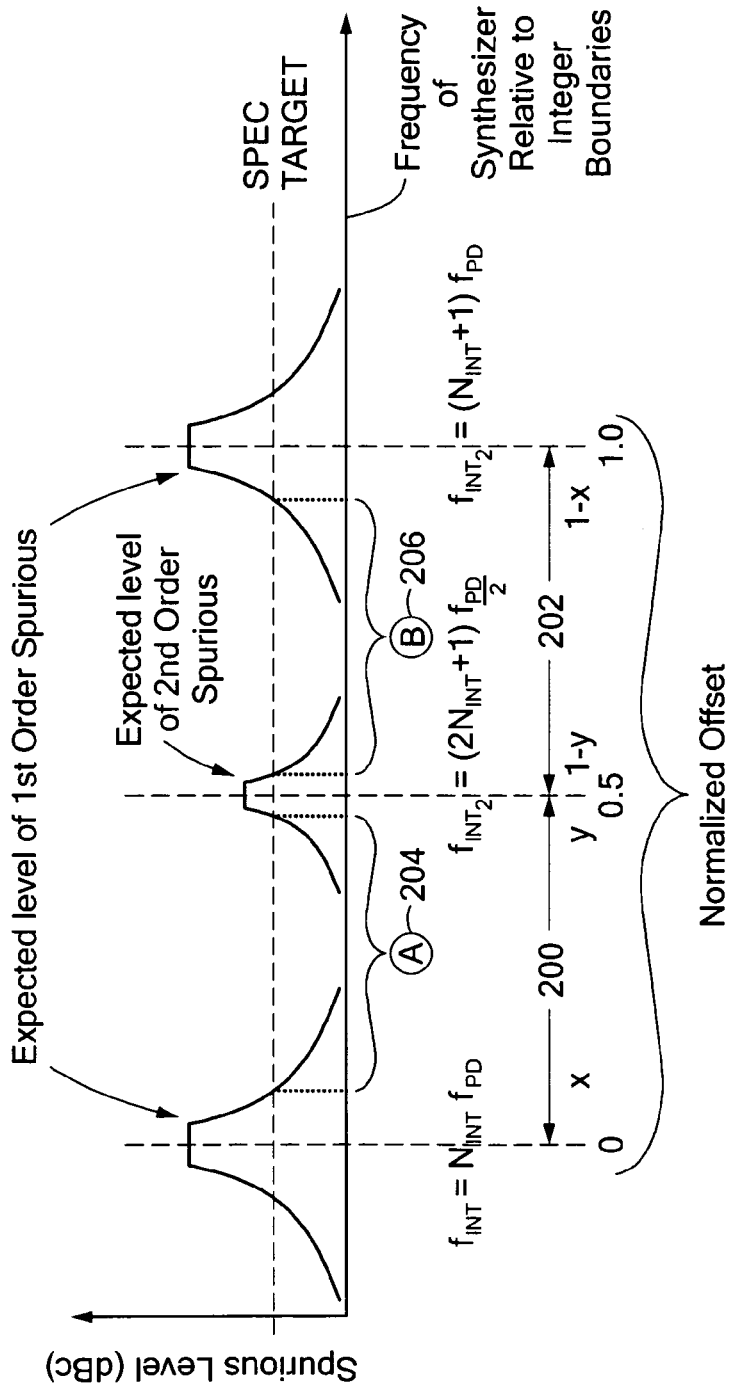
FIG. 5 depicts an example of expected spurious levels of the clock distribution system shown in FIG. 1 output as a function of an example of the output frequency normalized to one integer boundary interval.

It is common practice to use all M-dividers, in this example, dividers 37, 39, 41, and 43 as fixed dividers, even in the radio synthesizer paths. This approach often leads to frequencies that are near an IB and may result in spurious which are larger than desirable. Spurs generated when clock distribution system 14 is operating near the IB are larger than system 14 can typically handle, and are often unacceptable. If clock distribution system 14 is operating far from the IB, the spurs are smaller and usually acceptable to the system. An example of such a relationship is shown in FIG. 5.

Another common requirement is that the desired output frequencies $fo_1$-64 and $fo_2$-66 may need to be exact multiples of some channel spacing. In this case, all outputs are exact multiples of the channel spacing. Given fixed input external reference clock-20 and fixed master system $f_{clk}$-22, this can further restrict the range of allowable solutions. Exact frequency solutions are typically solved in fractional synthesizers by one of two methods: a) the fractional modulus or denominator is set to the ratio of the phase detector frequency to the channel spacing frequency, or some related multiple thereof, or b) the fractional modulus is fixed and large and the exact frequency counter value, Ngcd, is set to the ratio of the phase detector frequency to the greatest common divisor frequency (fgcd). The fgcd is the greatest common divisor of the phase detector frequency and the channel spacing frequency, or a related multiple. While both methods may be used, the later exact frequency method may be preferred as it usually generates much lower spurious at offset frequencies equal to multiples of the channel spacing frequency.

Part of the problem with using multiple integer division ratios has been related to the complexity of the solution. Previously, predicting spur locations and levels created by a given setting were not realizable and therefore it was not feasible to describe a systematic approach to setting the divider ratios to obtain an optimum low spurious solution. The method for reducing spurious of a clock distribution system of one or more embodiments of this invention provides a solution to the aforementioned problem and can predict the spurious frequencies and levels and select the optimum reference for the required output frequency.

Figure 2:
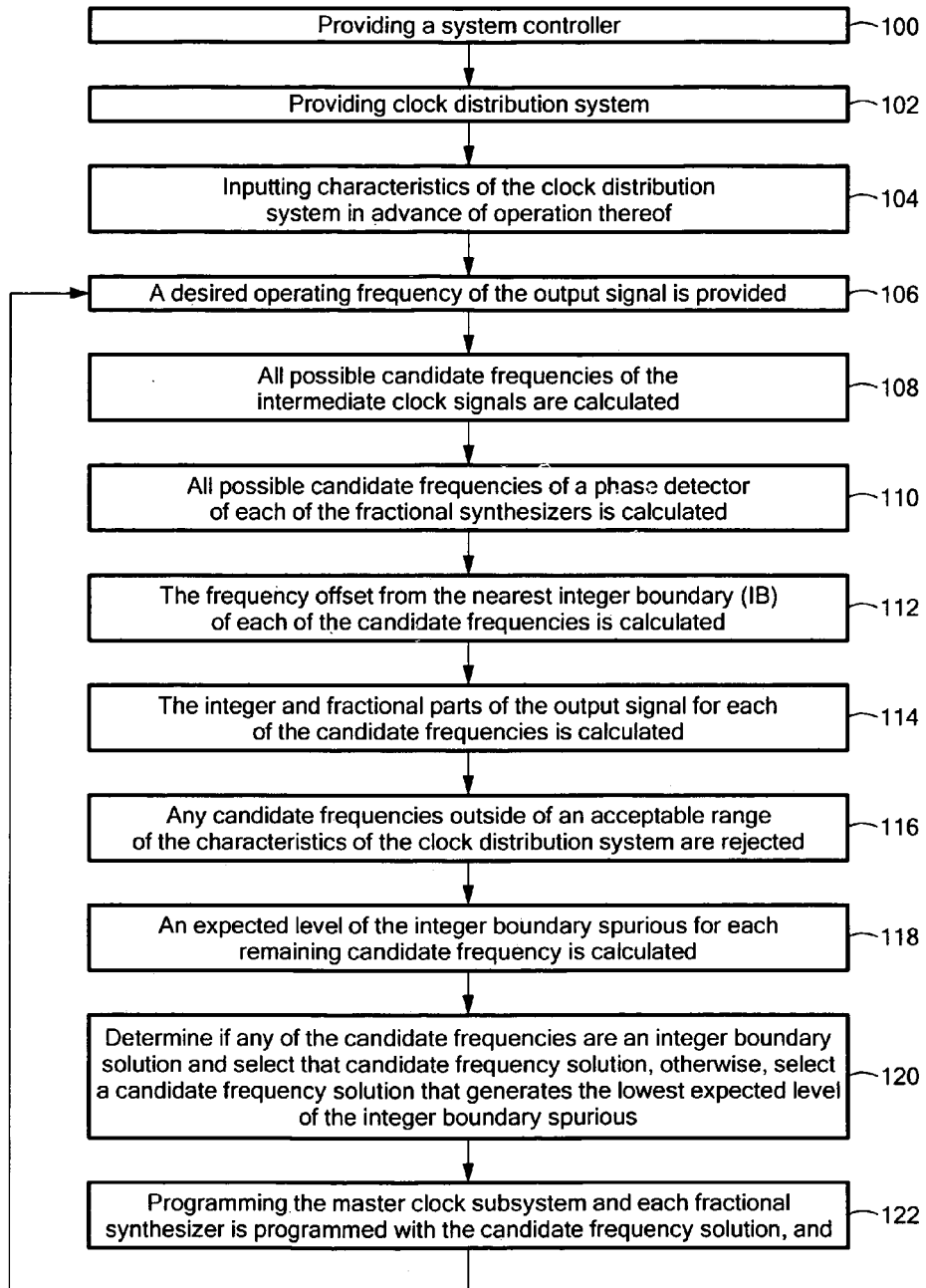
FIG. 2 is a flowchart showing the primary steps of one example of the method for reducing spurious for a clock distribution system of this invention.

There is shown in FIG. 2, one embodiment of the method for reducing spurious of a clock distribution system of this invention. The method preferably includes providing a system controller, step 100, and providing a clock distribution system, step 102, e.g., similar to clock distribution system 14 as discussed above with reference to FIG. 1. The method further includes inputting characteristics of the clock distribution in advance of operation of thereof, step 104, FIG. 2. A desired operating frequency of the output signal is then provided, step 106. All possible candidate frequencies of one or more intermediate clock signals are then calculated, step 108. All possible candidate frequencies of the phase detector of each of fractional synthesizers are calculated, step 110. The frequency offset from the nearest integer boundary of each of the candidate frequencies is then calculated, step 112. The integer and fractional parts of the output signal for each candidate frequency is then calculated, step 114. All candidate frequencies outside an acceptable range of the characteristics of the clock distribution system are rejected, step 116. An expected level of the integer boundary spurious for each remaining candidate frequency is then calculated, step 118. A determination is made whether any of the candidate frequencies are an integer boundary solution. If a candidate frequency is an integer boundary solution, that candidate frequency solution is selected, otherwise a candidate frequency solution that generates the lowest expected level of integer boundary spurious is selected, step 120. The master clock subsystem and each fractional synthesizer are programmed with the candidate frequency solution, step 122. Steps 106 to 122 are then performed as needed.

In one embodiment, the external reference signal has a fixed frequency. The characteristics of the clock distribution subsystem 14, FIG. 1, input in step 104, FIG. 2, may include IB spurious levels (typical spurious levels when operating near the Integer Boundary) and higher order IB Spurious levels (typical spurious levels when operating near higher order Integer Boundaries) over the operating range of fractional synthesizers 38 and/or fractional synthesizer 40 at the typical spurious levels.

The characteristics of clock distribution subsystem input in step 104 may also include typical spurious rolloff rates of IB spurs or higher order IB spurs as fractional synthesizer 38 and/or fractional synthesizer 40 is tuned away from an IB or a higher order IB.

The characteristics of clock distribution subsystem input in step 104 may also include minimum spurious levels, $Ps_{min}$, of IB spurs or higher order IB spurs as fractional synthesizer 38 and/or fractional synthesizer 40 is tuned away from an IB or a higher order IB.

The input characteristics of the clock distribution subsystem 14 input in step 104 may include a typical loop bandwidth of the fractional synthesizers 38 and/or fractional synthesizer 40.

The input characteristics of the clock distribution subsystem 14 input in step 104 may include reference clock signal frequency $f_{clk}$-22 synthesized by master clock subsystem 16. The reference clock signal $f_{clk}$-22 may have a fixed frequency.

The input characteristics of clock distribution subsystem 14 input in step 104 may include a realizable range of settings for M-dividers 37, 39, 41, and 43 of the master clock subsystem 16.

The characteristics of clock distribution subsystem 14 input in step 104 may include a realizable range of settings for master clock subsystem 14 and the setting for R-divider 40 of fractional synthesizer 38 and/or fractional synthesizer 40.

The input characteristics of clock distribution subsystem 14 input in step 104 may include a minimum limit or a maximum limit of fractional divider 46 of fractional synthesizer 38 and/or fractional synthesizer 40.

The input characteristics of clock distribution subsystem 14 input in step 104 may include allowable values of fractional divider 46 of fractional synthesizer 38 and/or fractional synthesizer 40.

The input characteristics of clock distribution system 14 input in step 104 may include a minimum or a maximum limit of the values of the greatest common divisor counter value Ngcd.

The input characteristics of clock distribution system 14 input in step 104 may include specific integer parts of the values of fractional divider 46 to be excluded.

The input characteristics of clock distribution system 14 input in step 104 may include a minimum limit or a maximum limit of the frequency of intermediate clock signals $f_{ref1}$-24, $f_{ref2}$-26 at the input to fractional synthesizers 38, 40, respectively.

The input characteristics of clock distribution system 14 input in step 104 may include a minimum limit or a maximum limit of a phase detector clock frequency fpd1, fpd2, at the input to the one or more phase detectors-42 of fractional synthesizers 38, 40, respectively.

The input characteristics of clock distribution system 14 input in step 104 may include fractional synthesizer 38 and/or fractional synthesizer 40 having a fixed modulus.

The input characteristics of clock distribution system 14 input in step 104 may include a minimum limit or a maximum limit of the frequency for each of fractional synthesizers 38, 40.

The input characteristics of clock distribution system 14 input in step 104 may include available values of division for divider $p_1$-48 at the output to fractional synthesizer 38.

The result of the method for reducing spurious of a clock distribution system of one or more embodiments of this invention is effectively reduced spurious. The method describes the necessary characterization information for the clock distribution system, predicts the spurious levels of the fractional synthesizers given the required operating conditions and characterization information of the clock distribution system and selects the operating conditions to eliminate various solutions that may be restricted by various limits or boundary conditions. The method is relatively simple and can predict and calculate the required settings for optimum performance. A clock distribution system solution can be created and shipped to a user and the method discussed above with reference to FIGS. 1 and 2 could be programmed into the system by the user.

In one embodiment, the method for reducing spurious for a clock distribution system of one or more embodiments of this invention may pre-calculate all known output frequencies and the resulting outputs may be stored in a look up table.

In another embodiment, the method for reducing spurious for a clock distribution system of this invention may pre-calculate or measure spurious as a function of the fractional offset value and then simply select solutions based upon the fractional value landing in a preferred region. If only a small number of regions are used, the method of this embodiment is relatively easy to implement but cannot easily choose between similar solutions in the same region. The method of this embodiment may be chosen for lower cost, less complex applications where a less stringent spurious solution may be acceptable.

In this embodiment, the method preferably includes providing a system controller, step 150, FIG. 4, and providing a clock distribution system, step 152, e.g., similar to clock distribution system 14, discussed above with reference to FIG. 1. The method further includes inputting characteristics of the clock distribution system in advance of operation thereof, step 154, FIG. 4. The method further includes calculating an expected level of integer boundary spurious as a function of fractional offset value to select a preferred region of operation of offset based upon the offset value, step 156, providing a desired frequency of the output signal, step 157, and selecting an integer boundary solution based on the fractional offset value being within a predetermined preferred region, step 158. The master clock subsystem and the one or more fractional synthesizers are programmed with the integer boundary solution, step 160. Steps 157-160 are then performed as needed.

For example, instead of calculating the actual level of the integer boundary spurious values as in step 118, FIG. 2, e.g., using equation (1) below, it may be sufficient to recognize that the frequency offset, foffset, has a range of values that vary from 0 to +/−fpd/2, as indicated at 200, FIG. 5. We can think of these values, normalized to fpd as a range of 0 to +/−0.5. Region 0.5 to 1.0, indicated at 202, is equivalent to the region −0.5 to 0.

It is apparent from equation (1) that larger absolute values of foffset, will result in lower spurious levels. It is also true that if second order spurious are of concern, that at some larger offsets, the second order spurious may be larger than the first order spurious, as is shown in FIG. 5 when the normalized offset is very close to 0.5. Hence, a region can be defined, stated as a normalized offset, or percent of fpd, where the first order spurious will be lower than some target amount. In the example shown in FIG. 4, predetermined target regions A-204 and B-206 suit this criteria. Regions A-204 and B-206 are preferably calculated using equation (2) below. Once target regions A-204 and B-206 are determined, it may be sufficient and simpler, in some applications to select solutions based solely on the percentage offset of the operating frequency from the integer boundary or the higher order integer boundary. In the simplest case, where only the first order integer boundary spurious is of concern and no candidates fall within regions A-204 or B-206, the best solution is the one with the largest absolute value of the frequency offset, abs (foffset). A similar selection criterion could be applied for cases where higher order spurious are considered.

In another example, the method for reducing spurious for a clock distribution system may calculate the optimum settings each time a change in the output frequency is required. This approach may be a lower cost solution for a clock distribution system with a large number of output frequencies because it may require much less memory than the former technique. The latter method also has the advantage of being able to calculate the best settings for frequencies that may not have been known in advance. The latter method may reduce cost and provide a generic design applicable to a wide number of solutions where a look up table approach may not be practical.

One embodiment of the calculation of the spurious level of the method for reducing spurious of a clock distribution system of this invention may require using an output synthesizer where the IB spurious levels are essentially flat when operating at an output frequency such that the frequency offset from the nearest IB frequency is less than the loop bandwidth, fbw. The calculation of the spurious level may also require the typical rate of rolloff of the IB spurious level versus offset frequency as a function of the loop filter of the output synthesizer. Hence, the typical spurious level is preferably measured as a function of frequency offset from the IB. Typically, the spur will roll off similar to that of a low pass filter where the offset and may be measured relative to the loop bandwidth, fbw. In this case, the rate of rolloff may be related to a loop filter type. A second order rolloff is common. The typical maximum rolloff may be limited by the isolation of the application circuit board. The spur characteristics can also be found for higher order spurs if required in a similar fashion. Once the characteristics are known for a given synthesizer, then the expected spurious power level, Ps, is estimated by the following equation:

$$Ps = \text{Spurious Power Level} = Ptyp - 10 * \log 10(1 + (abs(foff/fbw))^n), \quad (1)$$

where Ptyp is the typical integer boundary spurious level when operating with foff less than fbw, foff is the frequency difference between the VCO frequency and the nearest integer boundary frequency, and fbw is the 3 dB bandwidth of the closed loop transfer function of the PLL. That is, the transfer function of the reference phase to the output phase, which is normally a low pass transfer function, n is the order of the transfer function, and is given by the typical rolloff rate given by n=xdB/10. For example, if the spur rolls off at x equal to 20 dB/decade at offsets greater than the loop bandwidth, then n equals 2.

If the spur power level, Ps, given by the above equation is less than the expected minimum spurious level, $Ps_{min}$, then the value is set to $Ps_{min}$.

We can restate equation (1) above on a normalized frequency plot relative to the integer boundary frequency, fint, if all fvco and fbw frequencies are normalized to fint as shown by fvcon and fbwn in equation (2) below:

$$Ps(fvcon) = Ptyp - 10 * \log 10(1 + (abs(fvcon/fbwn))^n), \quad (2)$$

where any frequency, f, normalized to fint, is defined as fn, where fn is determined by Equation (3) below:

| fn = modulo(f, fint) | for 0 <= modulo(f, fint) <= 0.5 |
| fn = 1 − modulo(f, fint) | for 0.5 <= modulo(f, fint) <= 1.0 |

Expected spurious levels shown in FIG. 4 are plotted versus system output frequency normalized to the integer boundary frequency, fint, of a given candidate solution.

EXAMPLE

One example of the operation of the method for reducing spurious of clock distribution system of one embodiment of this invention discussed above with reference to FIGS. 1 and 2 is now discussed with exemplary constraints:

Exemplary Clock Distribution System Constraints:

| | |
|---|---|
| Available Clock: | $f_{clk}$-22 = 12 × 122.88 MHz = 1474.56 MHz. |
| Desired Output Frequency: | fo2-66 = 2010.1 MHz (preferably exact) |
| Max Fundamental Output Frequency = | 4 GHz |
| Min Fundamental Output Frequency = | 2 GHz |
| Max Ref Frequency | frefmax = 500 MHz |
| Max Phase Detector Freq. | fpdmax = 100 MHz |
| Min Division Ratio | Nmin = 20 |
| Available Values of M | M = 2, 3, or 5 |
| Available Values of R | R = 5, 6, or 7 |
| Fractional Modulus | Fixed $2^{24}$ |
| Min fgcd | fpd/$2^{24}$ |
| Max Ngcd | fpd/Minfgcd |
| Psmin | −110 dBc |

In this example, nine possible candidates using the values of master clock signal fclk divided by the three possible values for the M-dividers and three possible values for the R-dividers are shown in Table 1 below. As can be seen, all nine candidates are values which have the exact frequency solutions.

TABLE 1

Table of Candidate Solutions for the Example

| Case | 1 | 2 | 3 | 4 | 5 | 6 | 7 | 8 | 9 |
|---|---|---|---|---|---|---|---|---|---|
| M | 2 | 3 | 5 | 2 | 3 | 5 | 2 | 3 | 5 |
| R | 5 | 5 | 5 | 6 | 6 | 6 | 7 | 7 | 7 |
| fref | 737.28 | 491.52 | 294.91 | 737.28 | 491.52 | 294.91 | 737.28 | 491.52 | 294.91 |
| fpd | 147.46 | 98.3 | 58.98 | 122.88 | 81.92 | 49.15 | 105.33 | 70.22 | 42.13 |
| fint | 2064.38 | 1966.08 | 2005.4 | 1966.08 | 2048 | 2015.23 | 2001.19 | 2036.3 | 2022.25 |
| Nint | 14 | 20 | 34 | 16 | 25 | 41 | 19 | 29 | 48 |
| Nfrac | −36.81 | 44.78 | 7.97 | 35.82 | −46.26 | −10.44 | 8.46 | −37.31 | −28.85 |
| ffrac | −54.28 | 44.02 | 4.7 | 44.02 | −37.9 | −5.13 | 8.91 | −26.2 | −12.15 |
| ffrac2 | 38.89 | −10.26 | 9.4 | −34.84 | 6.12 | −10.26 | 17.82 | 17.82 | 17.82 |
| spur | 0 | −101 | −81 | 0 | −100 | −82 | 0 | −96 | −90 |
| spur2 | 0 | −112 | −111 | 0 | −108 | −112 | 0 | −117 | −117 |
| spuro | 0 | −101 | −81 | 0 | −99 | −82 | 0 | −96 | −90 |
| fgcd | 4000 | 4000 | 800 | 20000 | 20000 | 4000 | 2857 | 260 | 571 |
| Ngcd | 36864 | 24576 | 73728 | 6144 | 4096 | 12288 | 36864 | 270336 | 73728 |

Of the nine candidate solutions, cases 1, 4, and 7 have solutions for fref equal to 737.280, which exceed the maximum 500 MHz constraint. The method for reducing spurious for a clock distribution system rejected those candidates. The method then determined the phase detector frequency constraints, fpd, using the relationship fpd=fref/R. In this example, the calculated values of fpd are shown for the fref and R values:

| | | |
|---|---|---|
| 147.46 | 98.30 | 58.98 |
| 122.88 | 81.92 | 49.15 |
| 105.33 | 70.22 | 42.13 |

As shown in Table 2 below, the remaining cases 2, 3, 5, 6, 8 and 9 all have acceptable ranges of fpd:

TABLE 2

Candidates Constrained by Max fpd

| Case | 1 | 2 | 3 | 4 | 5 | 6 | 7 | 8 | 9 |
|---|---|---|---|---|---|---|---|---|---|
| M | 2 | 3 | 5 | 2 | 3 | 5 | 2 | 3 | 5 |
| R | 5 | 5 | 5 | 6 | 6 | 6 | 7 | 7 | 7 |
| fref | 737.28 | 491.52 | 294.91 | 737.28 | 491.52 | 294.91 | 737.28 | 491.52 | 294.91 |
| fpd | 147.46 | 98.3 | 58.98 | 122.88 | 81.92 | 49.15 | 105.33 | 70.22 | 42.13 |
| fint | 2064.38 | 1966.08 | 2005.4 | 1966.08 | 2048 | 2015.23 | 2001.19 | 2036.3 | 2022.25 |
| Nint | 14 | 20 | 34 | 16 | 25 | 41 | 19 | 29 | 48 |
| Nfrac | −36.81 | 44.78 | 7.97 | 35.82 | −46.26 | −10.44 | 8.46 | −37.31 | −28.85 |
| ffrac | −54.28 | 44.02 | 4.7 | 44.02 | −37.9 | −5.13 | 8.91 | −26.2 | −12.15 |
| ffrac2 | 38.89 | −10.26 | 9.4 | −34.84 | 6.12 | −10.26 | 17.82 | 17.82 | 17.82 |
| spur | 0 | −101 | −81 | 0 | −100 | −82 | 0 | −96 | −90 |
| spur2 | 0 | −112 | −111 | 0 | −108 | −112 | 0 | −117 | −117 |
| spuro | 0 | −101 | −81 | 0 | −99 | −82 | 0 | −96 | −90 |
| fgcd | 4000 | 4000 | 800 | 20000 | 20000 | 4000 | 2857 | 260 | 571 |
| Ngcd | 36864 | 24576 | 73728 | 6144 | 4096 | 12288 | 36864 | 270336 | 73728 |

Next the nearest integer boundary for each solution was calculated. The values of Nint which are out of range are eliminated by method for reducing spurious of a clock distribution system. In this example, all values of Nint less than 20 where eliminated. As can been seen in Table 3 below, cases 2, 3, 5, 6, 8 and 9 all have acceptable values of Nint greater than or equal to 20.

TABLE 3

Candidate Ranges for Min Value of Nint >= 20

| Case | 1 | 2 | 3 | 4 | 5 | 6 | 7 | 8 | 9 |
|---|---|---|---|---|---|---|---|---|---|
| M | 2 | 3 | 5 | 2 | 3 | 5 | 2 | 3 | 5 |
| R | 5 | 5 | 5 | 6 | 6 | 6 | 7 | 7 | 7 |
| fref | 737.28 | 491.52 | 294.91 | 737.28 | 491.52 | 294.91 | 737.28 | 491.52 | 294.91 |
| fpd | 147.46 | 98.3 | 58.98 | 122.88 | 81.92 | 49.15 | 105.33 | 70.22 | 42.13 |
| fint | 2064.38 | 1966.08 | 2005.4 | 1966.08 | 2048 | 2015.23 | 2001.19 | 2036.3 | 2022.25 |
| Nint | 14 | 20 | 34 | 16 | 25 | 41 | 19 | 29 | 48 |
| Nfrac | −36.81 | 44.78 | 7.97 | 35.82 | −46.26 | −10.44 | 8.46 | −37.31 | −28.85 |
| ffrac | −54.28 | 44.02 | 4.7 | 44.02 | −37.9 | −5.13 | 8.91 | −26.2 | −12.15 |
| ffrac2 | 38.89 | −10.26 | 9.4 | −34.84 | 6.12 | −10.26 | 17.82 | 17.82 | 17.82 |
| spur | 0 | −101 | −81 | 0 | −100 | −82 | 0 | −96 | −90 |
| spur2 | 0 | −112 | −111 | 0 | −108 | −112 | 0 | −117 | −117 |
| spuro | 0 | −101 | −81 | 0 | −99 | −82 | 0 | −96 | −90 |
| fgcd | 4000 | 4000 | 800 | 20000 | 20000 | 4000 | 2857 | 260 | 571 |
| Ngcd | 36864 | 24576 | 73728 | 6144 | 4096 | 12288 | 36864 | 270336 | 73728 |

A search for the lowest value of the sum of the predicted spurious levels was calculated using equation for (1) above. In this example, as shown in Table 4 below, case 2 yields the lowest predicted spurious value of −101 dBc when M-dividers 37, FIG. 1, set where to 3 and R-divider 40 was set to 5 and the output frequency was at 2010.1 MHz and p1=1.

Given the same input conditions, above but with the output frequency set to 1005.05 MHz, only the output divider p1 would change to p1 equal to 2.

The gcd frequency of case 2 also exists for an exact solution for the output signal, e.g., fo2-66, with the case 2, fpd was equal to 4 kHz, which is greater than the required fpd of $2^{24}$, which equals approximately 8.8 Hz.

TABLE 4

Lowest predicted spurious levels

| Case | 1 | 2 | 3 | 4 | 5 | 6 | 7 | 8 | 9 |
|---|---|---|---|---|---|---|---|---|---|
| M | 2 | 3 | 5 | 2 | 3 | 5 | 2 | 3 | 5 |
| R | 5 | 5 | 5 | 6 | 6 | 6 | 7 | 7 | 7 |
| fref | 737.28 | 491.52 | 294.91 | 737.28 | 491.52 | 294.91 | 737.28 | 491.52 | 294.91 |
| fpd | 147.46 | 98.3 | 58.98 | 122.88 | 81.92 | 49.15 | 105.33 | 70.22 | 42.13 |
| fint | 2064.38 | 1966.08 | 2005.4 | 1966.08 | 2048 | 2015.23 | 2001.19 | 2036.3 | 2022.25 |
| Nint | 14 | 20 | 34 | 16 | 25 | 41 | 19 | 29 | 48 |
| Nfrac | −36.81 | 44.78 | 7.97 | 35.82 | −46.26 | −10.44 | 8.46 | −37.31 | −28.85 |
| ffrac | −54.28 | 44.02 | 4.7 | 44.02 | −37.9 | −5.13 | 8.91 | −26.2 | −12.15 |
| ffrac2 | 38.89 | −10.26 | 9.4 | −34.84 | 6.12 | −10.26 | 17.82 | 17.82 | 17.82 |
| spur | 0 | −101 | −81 | 0 | −100 | −82 | 0 | −96 | −90 |
| spur2 | 0 | −112 | −111 | 0 | −108 | −112 | 0 | −117 | −117 |

TABLE 4-continued

Lowest predicted spurious levels

| Case | 1 | 2 | 3 | 4 | 5 | 6 | 7 | 8 | 9 |
|---|---|---|---|---|---|---|---|---|---|
| spuro | 0 | −101 | −81 | 0 | −99 | −82 | 0 | −96 | −90 |
| fgcd | 4000 | 4000 | 800 | 20000 | 20000 | 4000 | 2857 | 260 | 571 |
| Ngcd | 36864 | 24576 | 73728 | 6144 | 4096 | 12288 | 36864 | 270336 | 73728 |

Figure 3:
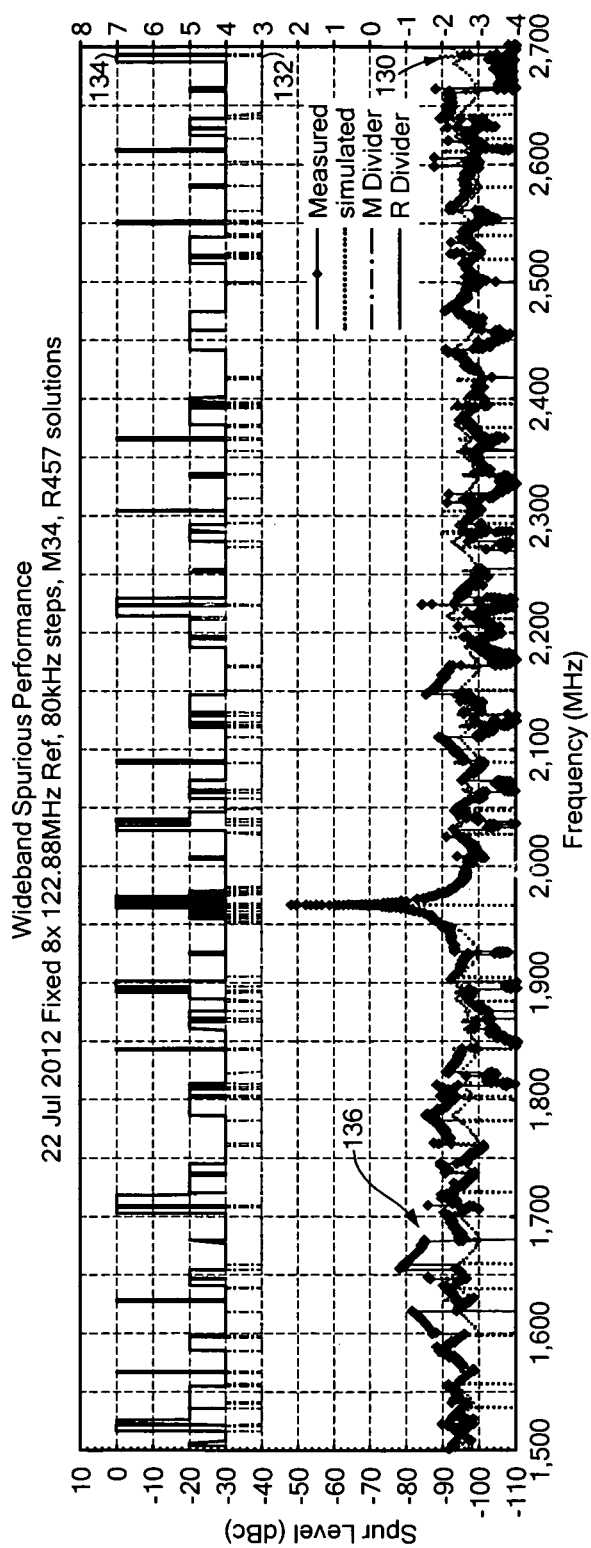
FIG. 3 depicts plots showing an example of the reduced spurious using one embodiment of the method for reducing spurious for a clock distribution system of this invention.

Plot 120, FIG. 3, shows some of the advantages of method for reducing spurious for a clock distribution system of one or more embodiments of this invention. Curve 130 shows an example of measured worst case spurious signals of exemplary clock distribution system 14, FIG. 1, measured as a function of the output frequency. In this example, the output of one of synthesizers 38 is shown, is comprised of an integrated wideband synthesizer IC, where the frequency of phase detector 42, fpd, of the synthesized output signal $fo_1$-64, and the required settings of the M-dividers 37, R-dividers 40 and Nf-divider 46 and integer divider 48 have been optimized according to method for reducing spurious for a clock distribution system of one or more embodiments of this invention. In this example, Plot 120, FIG. 3, was generated using a fixed clock, $f_{clk}$-22, set at 983.04 MHz. The worst case calculated spurious levels at each operating output frequency, $fo_1$-64, are indicated by curve 130. The M-divider 37 and R-divider 40 settings determined by method for reducing spurious for a clock distribution system are indicated by curves 132 and 134. The setting of Nf-divider 46, FIG. 2, are the natural settings required to operate at the given output frequencies, using $f_{clk}$-22 and the selected candidates for M-dividers 37 and R-dividers 40. Measured curve 136 of the actual spurious levels at each output frequency and setting shows a good agreement with the results calculated by the method for reducing spurious for a clock distribution system of one or more embodiment of this invention. Areas where small discrepancies exist could be improved by adding further restrictions to the method. An example restriction could be to restrict the solutions to use only even values of Nf in the problematic regions. Such refinements are based upon observations of the actual solution or IC in use, and are simply extensions of the method for reducing spurious for a clock distribution system of one or more embodiment of this invention.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant cannot be expected to describe certain insubstantial substitutes for any claim element amended.

Other embodiments will occur to those skilled in the art and are within the following claims.

What is claimed is:

1. A method for reducing spurious for a clock distribution system, the method comprising:
   a) providing a system controller;
   b) providing a clock distribution system including:
      a master clock subsystem responsive to an external reference signal configured to generate a master clock signal and one or more intermediate clock signals each at a sub-multiple of the master clock signal, and
      one or more fractional synthesizers each responsive to one of the one or more intermediate clock signals and each configured to generate an output signal at a desired frequency from a wide range of possible output frequencies based on a command from the system controller;
   c) inputting characteristics of the clock distribution system in advance of operation thereof;
   d) calculating an expected level of the integer boundary spurious as a function of fractional offset value to select a preferred region of operation;
   e) providing a desired frequency of the output signal of operation;
   f) selecting an integer boundary solution based on the fractional offset value being within a preferred predetermined region; and
   g) programming the master clock subsystem and the one or more fractional synthesizers with the integer boundary solution; and
   h) repeating steps e) through g) as needed.

2. The method of claim 1 in which the external reference signal has a fixed frequency.

3. The method of claim 1 in which the characteristics of the clock distribution subsystem includes IB spurious levels and higher order IB Spurious levels over the operating range of the one or more fractional synthesizers at the typical spurious levels.

4. The method of claim 1 in which the characteristics of clock distribution subsystem include typical spurious rolloff rates of IB spurs or higher order IB spurs as the one or more fractional synthesizers is tuned away from an IB or a higher order IB.

5. The method of claim 1 in which the input characteristics of the clock distribution subsystem include a typical loop bandwidth of the one or more fractional synthesizers.

6. The method of claim 1 in which the input characteristics of the clock distribution subsystem include a reference clock signal synthesized by the master clock subsystem.

7. The method of claim 6 in which the reference clock signal has a fixed frequency.

8. The method of claim 1 in which the input characteristics of the clock distribution subsystem include a realizable range of M-divider settings of the master clock subsystem.

9. The method of claim 1 in which characteristics of the clock distribution subsystem include a realizable range of R-divider settings of the master clock subsystem and the one or more frequency synthesizers.

10. The method of claim 1 in which the input characteristics of the clock distribution subsystem include a minimum limit or a maximum limit of a fractional divider of each of the one or more fractional synthesizers.

11. The method of claim 1 in which the input characteristics of the clock distribution system include a minimum limit or a maximum limit of the values of the greatest common divisor of a frequency of the output signal and a phase detector frequency at the input to the one or more fractional synthesizers.

12. The method of claim 1 in which the input characteristics of the clock distribution system include specific integer parts of the values of the fractional divider to be excluded.

13. The method of claim 1 in which the input characteristics of the clock distribution system include a minimum limit or maximum limit of the intermediate clock frequency at the input to the one or more fractional synthesizers.

14. The method of claim 1 in which the input characteristics of the clock distribution system include a minimum limit or a maximum limit of a phase detector clock frequency at the input to the one or more fractional synthesizers.

15. The method of claim 1 in which the input characteristics of the clock distribution system include the one or more fractional synthesizers having a fixed modulus.

16. The method of claim 1 in which the input characteristics of the clock distribution system include minimum spurious levels of IB spurs or higher order IB spurs as each of the one or more fractional synthesizers is tuned away from an IB or a higher order IB.

17. The method of claim 1 in which the input characteristics of the clock distribution system include allowable values of a fractional divider of the one or more fractional synthesizers.

18. The method of claim 1 in which the input characteristics of the clock distribution system include a minimum limit or a maximum limit of the frequency of a voltage controlled oscillator for the one or more fractional synthesizers.

19. The method of claim 1 in which the input characteristics of the clock distribution system include available values of division for a divider at the output to the one or more fractional synthesizers.

20. A method for reducing spurious for a clock distribution system, the method comprising:
 a) providing a system controller;
 b) providing a clock distribution system including:
  a master clock subsystem responsive to an external reference signal configured to generate a master clock signal and one or more intermediate clock signals each at a sub-multiple of the master clock signal, and
  one or more fractional synthesizers each responsive to one of the one or more intermediate clock signals and each configured to generate an output signal at a desired frequency from a wide range of possible output frequencies based on a command from the system controller;
 c) inputting characteristics of the clock distribution system in advance of operation thereof;
 d) providing a desired operating frequency of the output signal;
 e) calculating possible candidate frequencies of the one or more intermediate clock signals;
 f) calculating possible candidate frequencies of a phase detector of each of said one or more fractional synthesizers;
 g) calculating the frequency offset from the nearest integer boundary (IB) of each of said candidate frequencies;
 h) calculating integer and fractional parts of the output signal for each of the candidate frequencies;
 i) rejecting any candidate frequencies outside of an acceptable range of said characteristics of the clock distribution system;
 j) calculating an expected level of the integer boundary spurious for each remaining candidate frequency;
 k) if any of said candidate frequencies are an integer boundary solution, select that candidate frequency solution, otherwise, select a candidate frequency solution that generates the lowest expected level of the integer boundary spurious;
 l) programming the master clock subsystem and the one or more fractional synthesizers with the candidate frequency solution; and
 m) repeating steps d) through l) as needed.

* * * * *